United States Patent [19]

Sakamoto

[11] Patent Number: 5,136,246
[45] Date of Patent: Aug. 4, 1992

[54] APPARATUS WITH INTERMITTENT ENABLING MEANS FOR DETECTING END OF BATTERY LIFE

[75] Inventor: Jitsuo Sakamoto, Nara, Japan

[73] Assignee: Sharp Kabushiki Kaisha, Osaka, Japan

[21] Appl. No.: 525,553

[22] Filed: May 21, 1990

[30] Foreign Application Priority Data

May 26, 1989 [JP] Japan ................................ 1-61695[U]

[51] Int. Cl.⁵ ......................................... G01N 27/416
[52] U.S. Cl. .................................... 324/433; 324/426
[58] Field of Search ............... 324/426, 427, 429, 433, 324/435; 340/636; 320/48; 354/468

[56] References Cited

U.S. PATENT DOCUMENTS 3,997,831 12/1976 Hopfer ...................... 320/48
4,544,893 10/1985 Takahashi ..................... 324/435
4,660,027 4/1987 Davis ........................ 324/435

Primary Examiner—Jack B. Harvey
Attorney, Agent, or Firm—Nixon & Vanderhye

[57] ABSTRACT

An apparatus used in a system powered by a battery for detecting end of battery life. The apparatus includes an electromotive force comparing circuit getting power supply from a battery for comparing electromotive force of the battery with a predetermined value, and an intermittently enabling circuit for intermittently enabling the electromotive force comparing circuit. The electromotive force comparing circuit receives, only when it is enabled by the intermittently enabling circuit, power from the battery to operate. When not enabled, the electromotive force comparing circuit does not consume any power from the battery.

12 Claims, 7 Drawing Sheets

APPARATUS WITH INTERMITTENT ENABLING MEANS FOR DETECTING END OF BATTERY LIFE

BACKGROUND OF THE INVENTION

1. Field of the Invention

The present invention generally relates to apparatuses for detecting end of battery life, and more particularly, to an apparatus for detecting end of battery life and informing users thereof used in a portable equipment powered by a battery, such as watch, calculator or so-called electronic organizer.

2. Description of the Related Art

Figure 1:
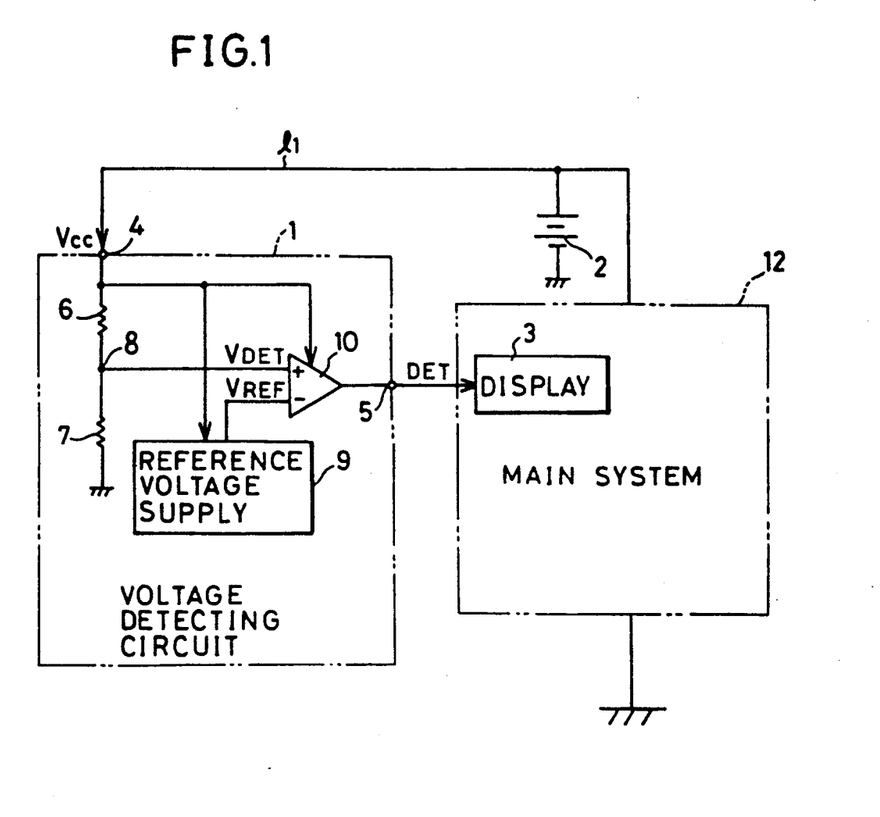
FIG. 1 is a block diagram of a system including a conventional apparatus for detecting end of battery life.

Referring to FIG. 1, a conventional apparatus for detecting end of battery life includes a voltage detecting circuit 1 connected, in parallel with a main system 12, to a battery 2 to get, together with the main system 12, power supply from the battery 2 for detecting that voltage of the battery 2 has fallen below a predetermined value and informing users of an end of battery life. The battery 2 has its negative electrode grounded.

The voltage detecting circuit 1 includes an input terminal 4 connected to the positive electrode of the battery 2 through an interconnection line, 11, two resistances 6 and 7 connected in series and in the stated order between the input terminal 4 and ground, a reference voltage supply circuit 9 connected to the input terminal 4 for supplying a predetermined reference voltage, and a comparator 10 having a non-inverted input terminal connected to a connection node 8 of the resistances 6 and 7 and an inverted input terminal connected to output of the reference voltage supply circuit 9 and getting power supply for operation from the battery 2 through the input terminal 4. The main system 12 includes a display unit 3, to which output of the comparator 10 is coupled through an output terminal 5.

The conventional apparatus operates as follows. The input terminal 4 receives voltage Vcc from the battery 2. The voltage Vcc is divided by the resistances 6 and 7 and a resulting voltage $V_{DET}$ at the connection node 8 of the resistances 6 and 7 is supplied to the non-inverted input terminal of the comparator 10. The voltage $V_{DET}$ varies with the fluctuation of the voltage Vcc supplied to the input terminal 4 from the battery 2.

The reference voltage supply circuit 9 receives the voltage Vcc from the input terminal 4, outputs a predetermined certain reference voltage $V_{REF}$ and applies the same to the inverted input terminal of the comparator 10.

The comparator 10 compares the voltage $V_{DET}$ WITH the reference voltage $V_{REF}$. If a relation $V_{DET} \geq V_{REF}$ stands, the comparator 10 applies a low-level signal DET to the display unit 3. If another relation $V_{DET} < V_{REF}$ stands, the comparator 10 applies a high-level signal DET to the display unit 3.

The display unit 3 includes a buzzer, a liquid crystal display unit or the like incorporated in the main system 12. The display unit 3 does nothing when the output signal DET of the comparator 10 is at the low level. When the signal DET applied from the comparator 10 is at the high level, the display unit 3 sounds the buzzer or displays with the liquid crystal display unit a warning that the life of the battery 2 is near its end. Operators can, therefore, prevent voltage of the battery 2 from falling the below a predetermined value by replacing the same with a new one.

Figure 2:
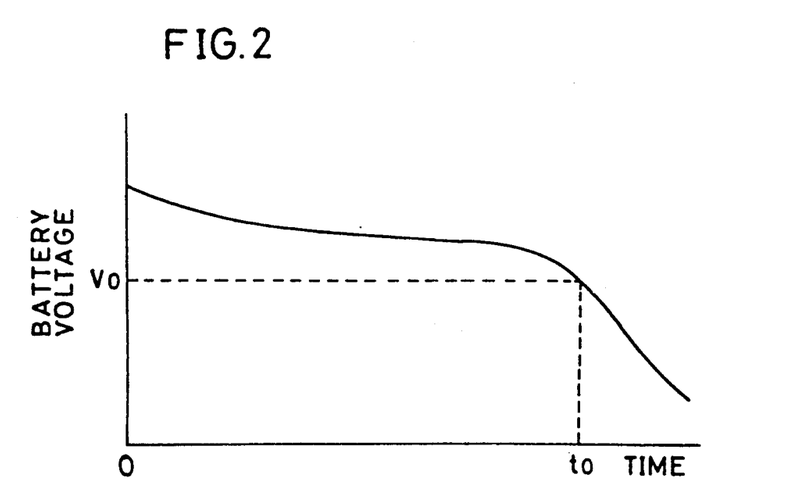
FIG. 2 is a diagram showing relationship between time and battery voltage.

Referring to FIG. 2, voltage of the battery 2 gradually decreases with the lapse of operating time thereof. A point at which voltage of the battery 2 becomes smaller than a predetermined voltage value V0 is defined as the life end of the battery 2. By setting values of the resistances 6 and 7 properly, therefore, the reference voltage $V_{REF}$ can be selected to be substantially equal to the voltage $V_{DET}$ at the connection node 8 of the resistances 6 and 7 when voltage of the battery 2 is V0. When the voltage Vcc of the battery 2 falls below the voltage V0, or at the time t0, life of the battery 2 is regarded as having come to an end.

As described above, the supply voltage applied to the main system 12 can be prevented from falling below the reference value by constantly monitoring voltage of the battery 2 with the voltage detecting circuit 1. However, such a conventional apparatus for detecting end of battery life has disadvantages as described below. Referring to FIG. 1, current flows constantly from the battery 2 to ground through the resistances 6 and 7. Further, the comparator 10 consumes power supplied from the battery 2 on a constant basis. Therefore, life of the battery 2 is shortened due to the existence of the voltage detecting circuit 1. When the power consumption of the main system 10 is relatively small, life of the battery 2 may be unduly shortened due to the power consumption of the voltage detecting circuit 1.

SUMMARY OF THE INVENTION

An object of the present invention is to provide an apparatus for detecting end of battery life which can prevent an unduly early end of battery life.

Another object of the present invention is to provide an apparatus for detecting end of battery life with a power consumption smaller than that in the conventional case.

Still another object of the present invention is to provide an apparatus for detecting end of battery life which can make the detection more precisely, with a lower power consumption, especially near the end of the battery life.

The above-mentioned objects can be achieved by providing an apparatus for detecting end of battery life used in a system powered by a battery, including: an electromotive force comparing circuit powered by the battery for comparing electromotive force of the battery with a predetermined value; and an intermittently enabling circuit for intermittently enabling the electromotive force comparing circuit.

According to a preferred embodiment of the present invention, the intermittently enabling circuit includes an enable signal generating circuit which generates an enable signal for enabling the electromotive force comparing circuit intermittently at time intervals defined as a function of electromotive force level of the battery.

According to a more preferred embodiment of the present invention, the intermittently enabling circuit further includes a switch responsive to the enable signal for allowing the battery to supply power to the electromotive force comparing circuit only when the enable signal is present.

According to a still more preferred embodiment of the present invention, the electromotive comparing circuit includes first voltage dividing circuit for dividing DC voltage supplied from the battery in a predetermined first ratio, and a first voltage comparing circuit for comparing the DC voltage divided by the first voltage dividing circuit with a predetermined comparison voltage.

According to a further preferred embodiment of the present invention, the electromotive force comparing circuit includes a second voltage dividing circuit for dividing DC voltage supplied from the battery in a predetermined second ratio smaller than the first one, and a second voltage comparing circuit for comparing the DC voltage divided by the second voltage dividing circuit with a comparison voltage.

In the apparatus described above, the electromotive force comparing circuit powered by the battery works only when it is enabled by the intermittently enabling circuit. When compared with a conventional case where continuous operation is required, therefore, the electromotive force comparing circuit consumes a lower power.

Further, since the enable signal generating circuit generates the enable signal intermittently at time intervals defined as a function of electromotive force level of the battery, the electromotive force comparing circuit can operate at optimum intervals in accordance with the electromotive force level of the battery.

The electromotive force comparing circuit can be enabled, therefore, at longer intervals when the battery still has enough electromotive force, and at shorter intervals when the end of battery life is approaching. Thus, it becomes possible to detect end of battery life with a higher precision when the end of battery life is approaching, without consuming an excessive power of the battery.

According to another preferred embodiment of the present invention, the intermittently enabling circuit comprises a timer for measuring an elapsed time from a predetermined point of time, a time comparing circuit for comparing the elapsed time measured by the timer with a predetermined reference time, and a circuit for generating the enable signal at intervals of a predetermined first time before the reference time passes, and at intervals of a predetermined second time shorter than the first one after the reference time has passed.

In the apparatus structured as described above, when an approximate lifetime of the battery is previously known, electromotive force of the battery can be checked at longer time intervals when life of the battery is expected to last yet long, and at shorter intervals when the end of battery life is approaching. Thus, the apparatus can detect end of battery life with enough precision, without consuming an excessive power of the battery.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
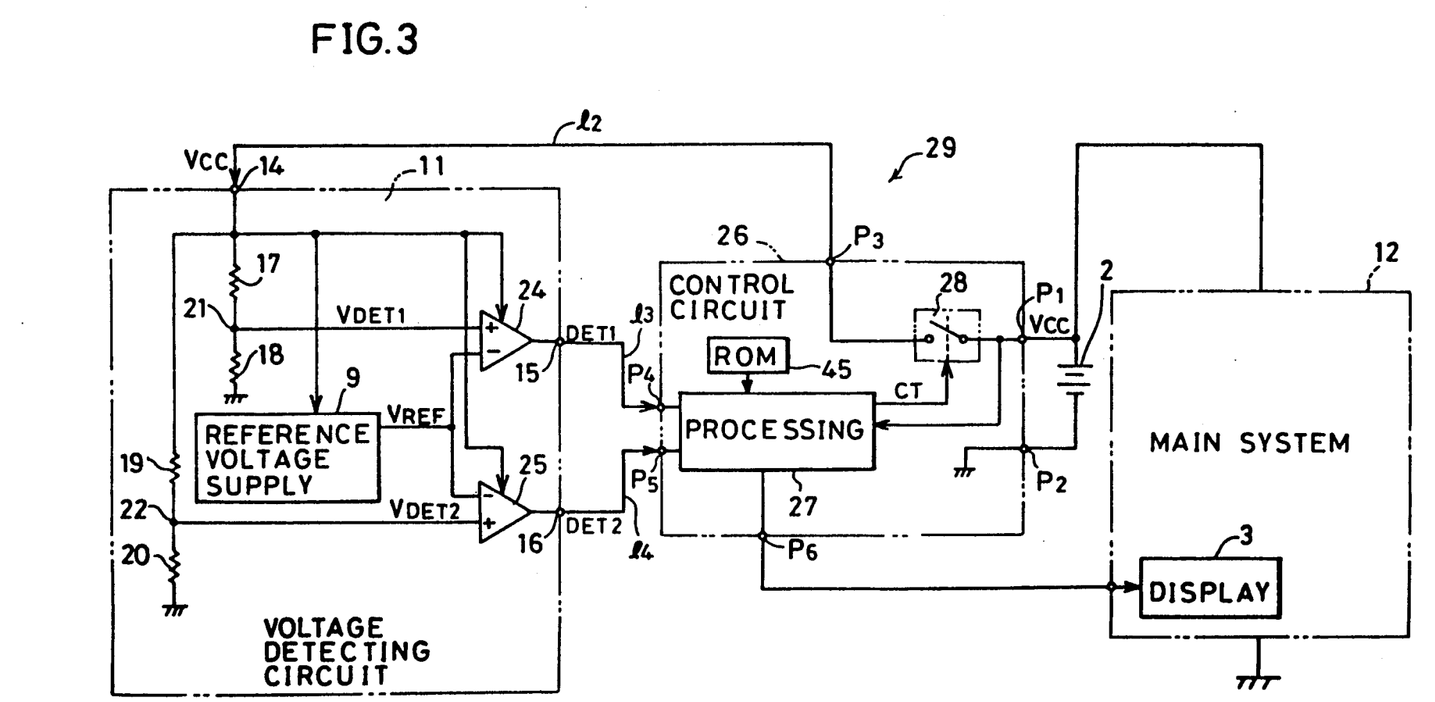
FIG. 3 is a block diagram showing a system including an apparatus for detecting end of battery life according to a first embodiment of the present invention.

FIG. 3 is a block diagram showing a system including an apparatus 29 for detecting end of battery life according to a preferred embodiment of the present invention. The system is applied to a portable electronic equipment such as electronic organizer and includes a main system 12 and an apparatus 29 for detecting end of battery life which are together powered by a battery 2.

The apparatus 29 is connected in parallel with the main system 12 to the battery 2. The apparatus 29 includes a voltage detecting circuit 11 for detecting voltage change of the battery 2, and a control circuit 26 for controlling the voltage detecting circuit 11 for intermittent operation thereof.

The control circuit 26 includes input ports P1 and P2 connected to the positive and negative electrodes of the battery 2, respectively, two other input ports P4 and P5, output ports P3 and P6, a switch 28 provided between the input port P1 and the output port P3, a processing circuit 27 including a microcomputer or the like powered by the ports P4, P5 and P6 to be responsive to signals entered from the input ports P4 and P5 for closing and opening the switch 28, and a ROM (read-only memory) 45 connected to the processing circuit 27 and storing programs to be executed by the processing circuit 27 and other necessary data therein. The input port P2 is grounded.

The voltage detecting circuit 11 includes an input terminal 14 and output terminals 15 and 16 connected to the ports P3, P4 and P5 of the control circuit 26, respectively, through respective connection lines 12, 13 and 14, resistances 19 and 20, and 17 and 18 each connected in series and in the stated order between the input terminal 14 and ground, a reference voltage supply circuit 9 connected to the input terminal 14 for outputting a reference voltage $V_{REF}$, a comparator 24 having a non-inverted input terminal connected to a connection node 21 of the resistances 17 and 18 and an inverted input terminal connected to output of the reference voltage supply circuit 9, and another comparator 25 having a non-inverted input terminal connected to a connection node 22 of the resistances 19 and 20 and an inverted input terminal connected to the output of the reference voltage supply circuit 9. The both comparators 24 and 25 are powered by the battery 2 through the input terminal 14, the port P3, the switch 28 and the port P1. The comparator 24 has its output connected to the input terminal 15. The comparator 25 has its output connected to the output terminal 16.

The resistances 17 and 18 are provided for dividing the voltage Vcc applied from the battery 2 to the input terminal 14 by a predetermined ratio, for converting the divided voltage into a voltage $V_{DET1}$, which varies depending on the voltage Vcc of the battery, and for applying the voltage $V_{DET1}$ to the comparator 24. The resistances 19 and 20 are provided for dividing the voltage Vcc of the battery 2 by a predetermined ratio, for converting the divided voltage into a detection voltage $V_{DET2}$, which varies with the voltage Vcc, and for applying the voltage $V_{DET2}$ to the comparator 25.

The main system 12 includes a display unit 3 dedicated to itself. The processing circuit 27 is connected to the display unit 3 through the output port P6. When life end of the battery 2 is detected, the display unit 3 displays a message indicative of the fact. The display unit 3 preferably includes, therefore, a buzzer or a liquid crystal display unit consuming a lower power.

Each of the resistance values of the resistances 17, 18, 19 and 20 is selected to satisfy the following relational expression when the voltage Vcc of the battery 2 has a normal value.

$$V_{DET2} < V_{DET1} < Vcc \quad (1)$$

Figures 4, 5:
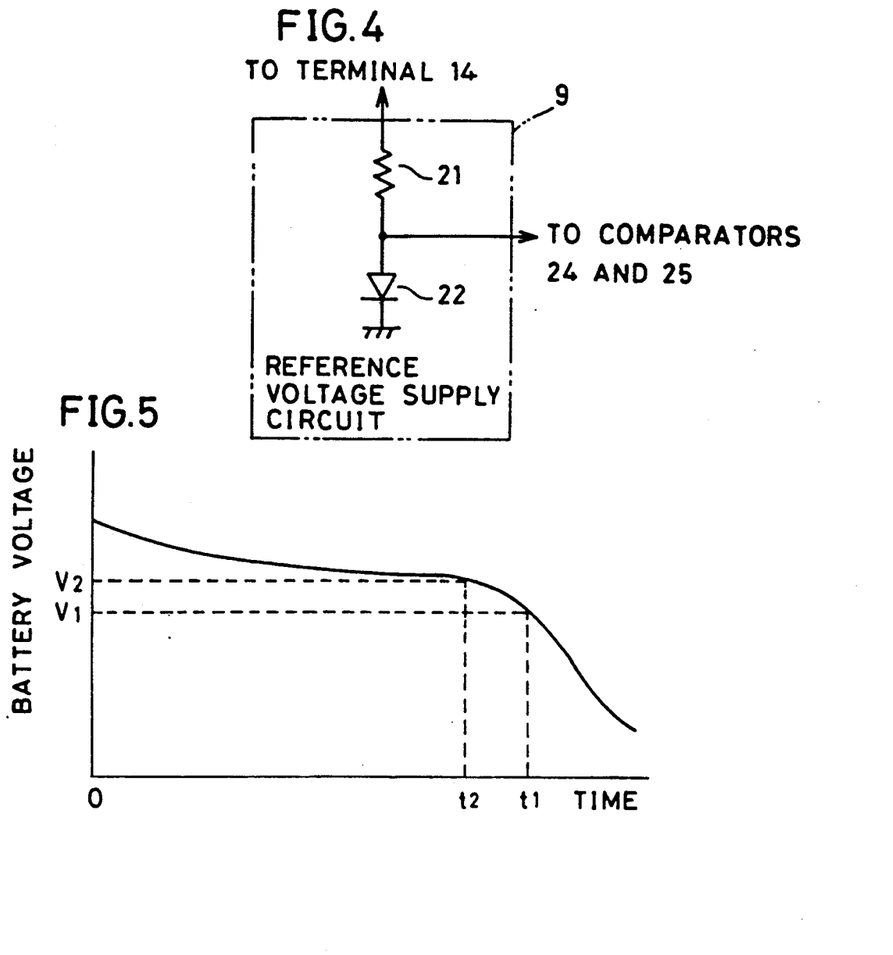
FIG. 4 is a block diagram of a reference voltage supply circuit.
FIG. 5 is a diagram showing relationship between operating time of a battery and battery voltage.

Referring to FIG. 4, the reference voltage supply circuit 9 includes a resistance 21 and a diode 22 connected in series and in the stated order between the input terminal 14 and ground. The diode 22 is provided such that current flows toward ground in the forward direction. Potential at a connection node between the resistance 21 and the diode 22 in the reference voltage supply circuit 9 is applied to the two comparators 24 and 25 as a reference voltage $V_{REF}$.

Referring to FIGS. 3 and 4, the apparatus for detecting end of battery life according to the present preferred embodiment operates as follows. The processing circuit 27 powered by the battery 2 closes the switch 28 after keeping the same in the open state for a time determined in a manner described later. The closed switch 28 permits the battery 2 to supply power to the voltage detecting circuit 11 through the output port P3, the connection line 12 and the input terminal 14.

The resistances 17 and 18 divide the voltage Vcc of the battery 2 in the predetermined ratio and supply the resulting voltage $V_{DET1}$ to the non-inverted input terminal of the comparator 24. The resistances 19 and 20 divide the voltage Vcc in the predetermined ratio and supply the resulting voltage $V_{DET2}$ to the non-inverted input terminal of the comparator 25.

The reference voltage supply circuit 9 supplies the certain reference voltage $V_{REF}$ determined depending on potential difference across the diode 22 to the inverted input terminals of the comparators 24 and 25.

The comparator 24 compares the voltage $V_{DET1}$ with the reference voltage $V_{REF}$. What the voltage $V_{DET1}$ is higher than the reference voltage $V_{REF}$, the comparator 24 makes value of the output signal DET1 represent logical "1", or otherwise, the comparator 24 makes the same represent logical "0".

The comparator 25 compares the voltage $V_{DET2}$ with the reference voltage $V_{REF}$. When the voltage DET2 is higher than the reference voltage $V_{REF}$, the comparator 25 makes the output signal DET2 represent value of logical "1", or otherwise, the comparator 25 makes the same represent value of logical "0".

The outputs signals DET1 and DET2 of the comparators 24 and 25 are applied to the processing circuit 27 through the connection lines 13 and 14, respectively.

The processing circuit 27 determines, depending on values of the signals DET1 and DET2, the time intervals at which the switch 28 operates in the following manner.

(1) Signals DET1 and DET2 representing together logical "1".

In this case, the processing circuit 27 sets the intervals of closing the switch 28 to a predetermined time W1. The processing circuit 27 resets the timer at the same time that it opens the switch 28. The processing circuit 27 again closes the switch 28 after the time W1 has passed. Thereafter, the same operation is repeated.

(2) Signal DET1 representing logical "1" and signal DET2 representing logical "0".

In this case, the processing circuit 27 sets the intervals of closing the switch 28 to a time W2. The time W2 is shorter than the time W1. This results from a determination that the voltage Vcc of the battery 2 has considerably decreased due to the fact that voltage $V_{DET2}$ is lower than the reference voltage $V_{REF}$. Since the other voltage $V_{DET1}$ is still higher than the reference voltage $V_{REF}$, however, it is not determined that life of the battery 2 has come to an end.

Having set the intervals to W2, the processing circuit 27 resets the timer at the same time it opens the switch 28. The processing circuit 27 closes the switch 28 again after the time W2 has passed from the timer reset. Thereafter, the same operation is repeated.

(3) Signals DET1 and DET2 representing together logical "0".

In this case, the processing circuit 27 makes determination that life of the battery 2 has ended. The processing circuit 27 makes, via the output port P6, the display unit 3 display the information that life of the battery 2 has ended. When the display unit 3 is implemented as informing means such as a buzzer, the processing circuit 27 makes the buzzer sound.

The processing circuit 27 makes determinations as described above from the following reasons. The fact that both of the signals DET1 and DET2 are logical "0" means that both of the voltages $V_{DET1}$ and $V_{DET2}$ have fallen below the reference voltage $V_{REF}$. The resistance values of the resistances 17, 18, 19 and 20 are selected to always satisfy the relation $V_{DET1} > V_{DET2}$. Accordingly, the voltage $V_{DET1}$ having fallen below the reference voltage $V_{REF}$ means that the voltage Vcc of the battery 2 has lowered considerably to such an extent that the normal operation of the main system 12 can not be maintained.

Referring to FIG. 5, it is assumed that when the voltage Vcc of the battery 2 is a predetermined voltage V2, the voltage $V_{DET2}$ becomes equal to the reference voltage $V_{REF}$. The time thereof is supposed to be t2. It is also assumed that when the voltage Vcc further falls down and reaches a predetermined voltage V1, the voltage $V_{DET1}$ becomes equal to the reference voltage $V_{REF}$. The time thereof is supposed to be t1.

The voltage Vcc of the battery 2 is sufficiently high during the time 0 to t2. During this period, no rapid fall of the voltage Vcc of the battery 2 can be expected. Accordingly, it will not cause any problem even if the intervals of enabling the voltage detecting circuit 11 are made longer during the time 0 to t2.

After the time t2, however, the voltage Vcc is lower than V2. It is determined, therefore, that the life end of the battery 2 is approaching. Accordingly, the intervals of enabling the voltage detecting circuit 11 must be shortened after the time t2; otherwise the voltage Vcc of the battery 2 may undesirably show a rapid fall when the voltage detecting circuit 11 is not operating.

Further, when the voltage Vcc falls below V1, it is determined that life of the battery 2 has ended.

Figure 6:
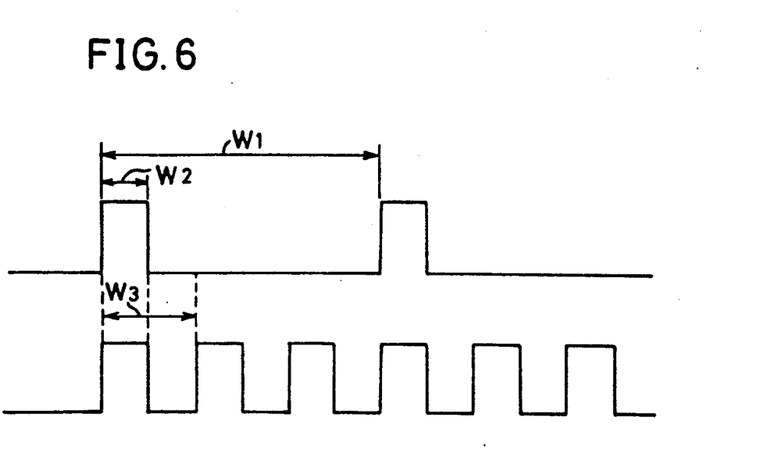
FIG. 6 is a waveform chart showing two types of waveforms for enabling a voltage detecting circuit.

Referring to FIG. 6, the interval W1 for the voltage Vcc of a sufficiently high value is, for example, three times as long as the interval W3 for the voltage Vcc of a value lower than the voltage V2. Thus, the processing circuit 27 enables the voltage detecting circuit 11 only for a duration W2 in the interval W1 when the voltage Vcc of the battery 2 has a sufficiently high value. When the life end of the battery 2 is approaching, the processing circuit 27 enables the voltage detecting circuit 11 for the duration W2 at intervals of the time W3, a third of the time W1. The period W2 for which the voltage detecting circuit 11 is enabled is set long enough for the voltage detecting circuit 11 to come to provide stable output after the reception of power.

Figure 7:
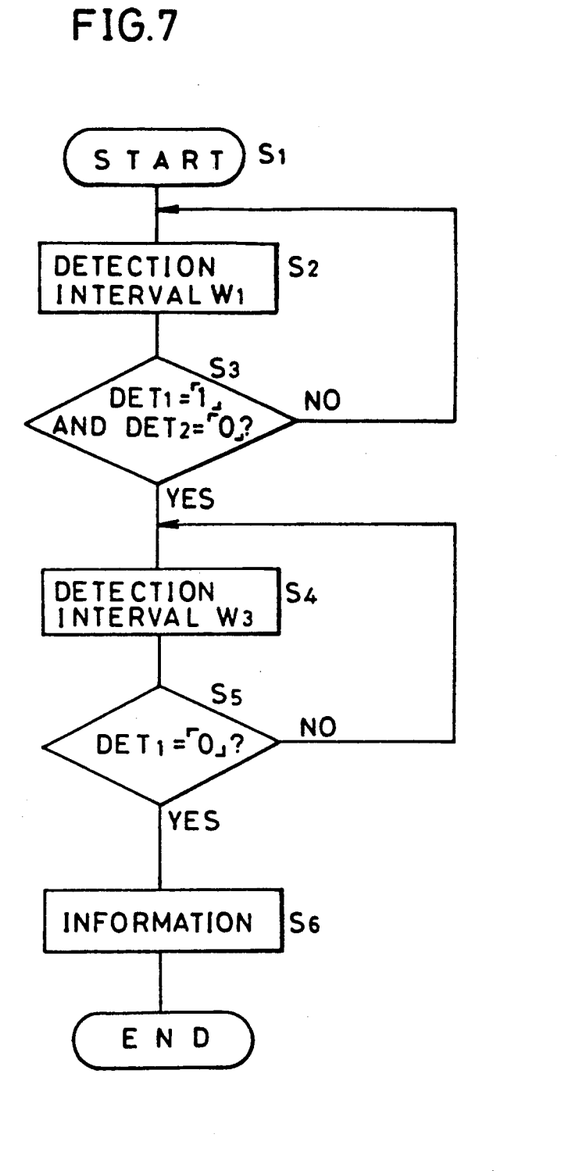
FIG. 7 is a flow chart of a program in which intervals of enabling a voltage detecting circuit is determined.

Referring to FIG. 7, a program executed by the processing circuit 27 has a control flow as follows. At step S1, a setting of the battery 2 permits power supply to the processing circuit 27, starting the program.

The processing proceeds to step S2, where after the interval W1, the processing circuit 27 applies a control signal CT to the switch 28 and enables the voltage detecting circuit 11. Further at step S2, the processing circuit 27 accepts the incoming signals DET1 and DET2 from the voltage detecting circuit 11.

The control proceeds to step S3, where the processing circuit 27 determines whether or not the signals DET1 and DET2 are logical "1" and "0", respectively. If the determination is NO, it is determined that the voltage Vcc of the battery 2 has a sufficiently high value because the DET1 and DET2 are together supposed to be logical "1". The control returns, therefore, to step S2. If the determination at step S3 is YES, the control proceeds to step S4.

When the control has proceeded to step S4, it is determined that the voltage Vcc of the battery 2 has fallen a little and that the life end of the battery 2 is approaching. At step S4, therefore, the processing circuit 27 selects W3 which is shorter than W1 as the intervals of enabling the voltage detecting circuit 11. After the interval W3, the processing circuit 27 transmits the control signal CT to the switch 28 for closing the same. The voltage detecting circuit 11, in response to the power supply, compares $V_{DET1}$ and $V_{DET2}$ with the reference voltage $V_{REF}$, and outputs the signals DET1 and DET2. The processing circuit 27 accepts the incoming signals DET1 and DET2.

Subsequently, at step S5, the processing circuit 27 makes determination as to whether the signal DET1 is logical "0" or not. If the determination is NO, which means that the voltage Vcc of the battery 2 has not fallen to any critical value, the control returns to step S4. If the determination is YES, the control proceeds to step S6.

At step S6, it is determined that life of the battery 2 has ended, based on the fact that the voltage Vcc of the battery 2 has fallen below the predetermined voltage. The processing circuit 27 makes, via the output port P6, the display unit 3 display a message indicative of the life end of the battery 2. Thereafter, the program comes to an end.

Thus, users of the main system 12 can recognize that the life end of the battery 2 is approaching before the end actually comes. By replacing the battery 2 with a new one before the voltage Vcc of the battery 2 falls to a more critical level, undesirable situation can be obviated.

Figure 8:
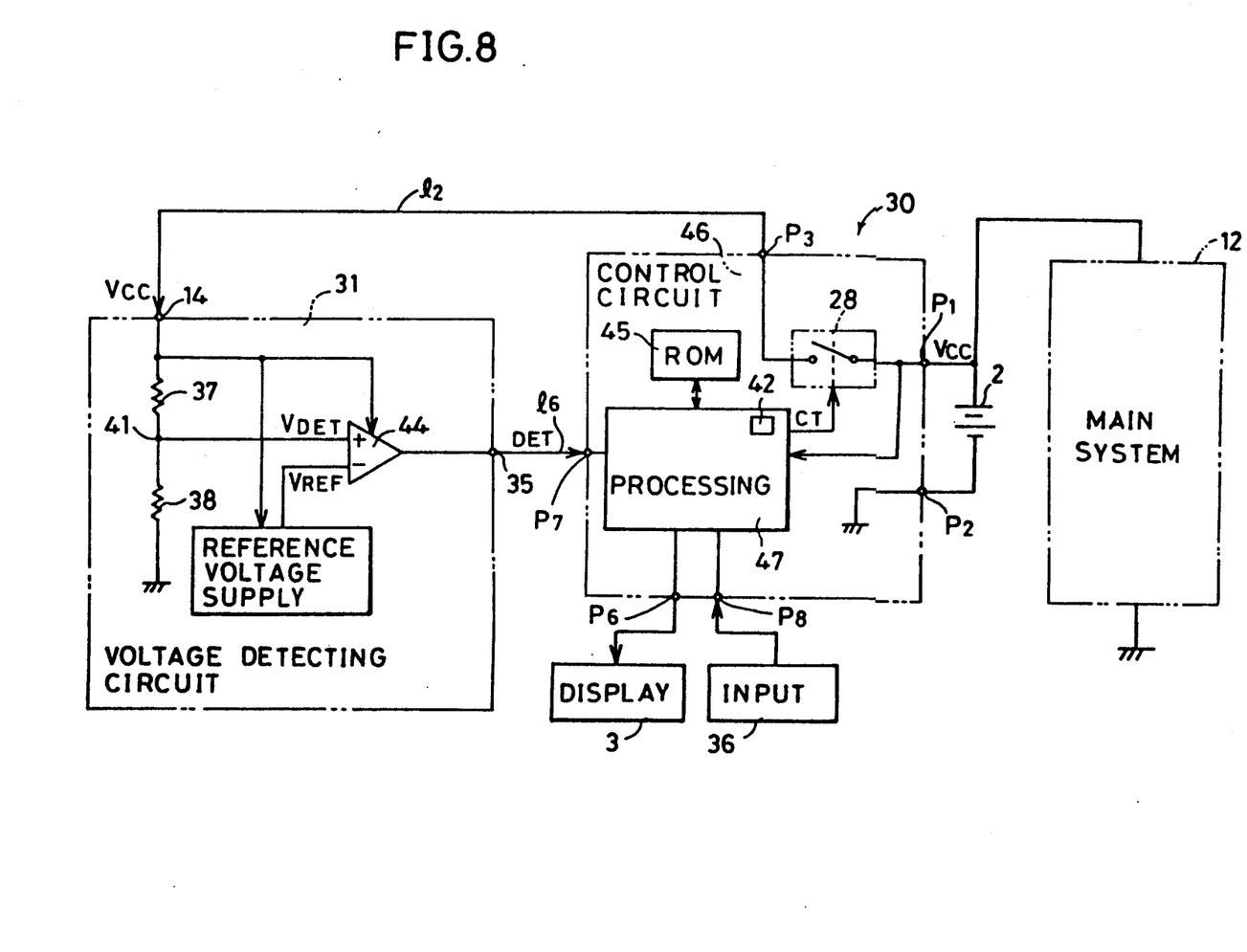
FIG. 8 is a block diagram showing a system including an apparatus for detecting end of battery life according to a second preferred embodiment of the present invention.

FIG. 8 is a block diagram showing a system including an apparatus 30 for detecting end of battery life according to a second preferred embodiment of the present invention. Referring to the diagram, the system includes a main system 12 for executing functions of, for example, an electronic organizer, a battery 2 for supplying power to drive the main system 12, and the apparatus 30 connected to the battery 2 for detecting end of battery life and for detecting the life end of the battery 2 for giving a warning.

The apparatus 30 includes a voltage detecting circuit 31 for detecting that voltage of the battery 2 has fallen below a reference voltage, a control circuit 46 connected to the battery 2 and the voltage detecting circuit 31 for controlling the voltage detecting circuit 31 to intermittently enable the same, a display unit 3 connected to the control circuit 46 for displaying a warning that the life end of the battery has been detected, and an input unit 36 with which operators enter an expected lifetime of the battery 2 in the control circuit 46.

The control circuit 46 includes input ports P1 and P2 connected to the positive and negative electrodes of the battery 2, respectively, an output port P3, an output port P6 to which the display unit 3 is connected, an input port P7 to which is connected the voltage detecting circuit 31, and an input port P8 to which is connected the input unit 26. The input port P2 is grounded.

The control circuit 46 includes a processing circuit 47 connected to the input ports P1, P7 and P8 and to the output port P6 for making an operation for enabling the voltage detecting circuit 31, a switch 28 provided between the input port P1 and the output port P3 for connecting them under control of the processing circuit 47, and a ROM 45 connected to the processing circuit 47 and having programs to be executed by the processing circuit 47 and the like stored in advance therein.

The processing circuit 47 comprises an interval timer 42. The processing circuit 47 is implemented as a microcomputer or the like. The processing circuit 47 operates in two modes, i.e., a normal operation mode and a so-called stand-by mode. In the normal operation mode, the processing circuit 47 consumes current of several hundreds $\mu$. In the stand-by mode, however, the processing circuit 47 consumes about as little as several tens $\mu$.

The voltage detecting circuit 31 has an input terminal 14 and an output terminal 35 which are connected to the output port P3 and the input port P7 of the control circuit 46, respectively, through connection lines 12 and 16. The voltage detecting circuit 31 includes two resistances 37 and 38 connected in series and in the stated order between the input terminal 14 and ground, a reference voltage supply circuit 9 connected to the input terminal 14 for supplying a predetermined reference voltage $V_{REF}$, and a comparator 44 getting power supply from the battery 2 through the input terminal 14 and having a non-inverted input terminal connected to a connection node 41 of the resistances 37 and 38, an inverted-input terminal connected to output of the reference voltage supply circuit 9 and an output connected to the output terminal 35.

When the switch 28 is opened, the voltage Vcc of the battery 2 is supplied only to the processing circuit 47. The processing circuit 47 constantly receives power for operation from the battery 2. When the switch 28 is closed under control of the processing circuit 47, the voltage Vcc of the battery 2 is supplied to the input terminal 14 of the voltage detecting circuit 31. In the voltage detecting circuit 31, the reference voltage supply circuit 9 and the comparator 44 operate upon reception of the voltage Vcc of the battery 2 while current flow occurs toward ground through the resistances 37 and 38.

The apparatus 30 shown in FIG. 8 operates as follows. The processing circuit 47 operates, receiving power from the battery 2. The processing circuit 47 transmits a control signal CT to the switch 28 for a certain time at intervals determined in a manner as described later. The switch 28 electrically connects, in response to the control signal CT, the input port P1 and the output port P3 as long as the control signal CT is present.

While the switch 28 receives the control signal CT, the input terminal 14 of the voltage detecting circuit 31 is supplied with the voltage Vcc of the battery 2. The voltage Vcc is divided in a ratio between the resistance values of the resistances 37 and 38 and the resulting voltage $V_{DET}$ is supplied to the comparator 44. The reference voltage supply circuit 9 supplies a predetermined reference voltage $V_{REF}$ to the inverted input terminal of the comparator 44.

The comparator circuit 44 compares the voltage $V_{DET}$ with the reference voltage $V_{REF}$. When the voltage $V_{DET}$ is higher than the reference voltage $V_{REF}$, the comparator 44 makes its output signal DET logical "1". When the voltage $V_{DET}$ is lower than or equal to the reference voltage $V_{REF}$, the comparator 44 makes the output signal DET logical "0".

The signal DET is applied to the processing circuit 47 through the output terminal 35 and the input port P7. When the received signal DET is logical "1", the processing circuit 47 determines an interval to the subsequent operation of enabling the voltage detecting circuit 31 and halts the transmission of the control signal CT. The processing circuit 47 activates the timer 42 and put itself in the stand-by state. The processing circuit 47 detects with the timer 42 that the predetermined time has passed and then put itself in the operating state again.

When the received signal DET is logical "0", the processing circuit 47 informs users with the display unit 3 that the life end of the battery 2 is approaching.

In the present embodiment, the processing circuit 47 intermittently enables the voltage detecting circuit 31 in the same manner as in the first embodiment. The present embodiment is characterized, however, by the setting manner of intervals of enabling the voltage detecting circuit 31.

Figure 9:
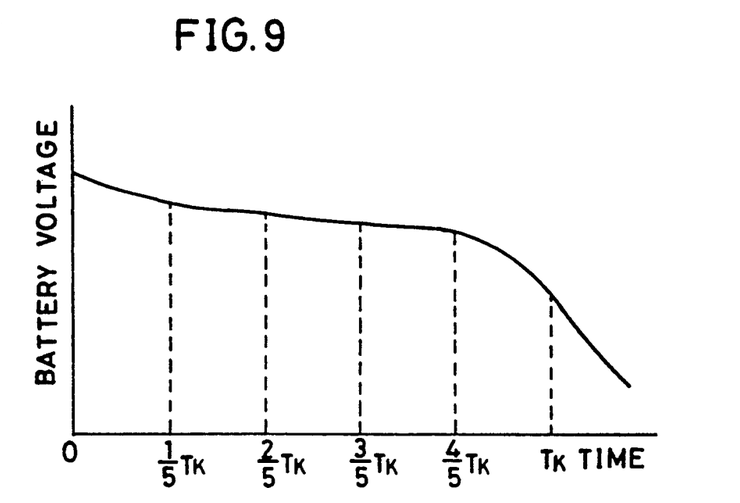
FIG. 9 is a diagram showing relationship between operating time of a battery and battery voltage.

Referring to FIG. 9, an expected lifetime Tk of the battery is given in advance to the processing circuit 47 through the input unit 36. The processing circuit 47 divides the expected lifetime Tk into, for example, five equal periods. The processing circuit 47 selects different time intervals of enabling the voltage detecting circuit 31 for each of the five periods. The processing circuit 47 monitors with the timer 42 an elapsed time from the start of processing. Thus, the processing circuit 47 can determine intervals of enabling the voltage detecting circuit 31 according to the elapsed time.

As described above, the battery supplies a sufficiently high voltage immediately after the start of operation. Generally, a certain time passes until the end of the battery life. Therefore, the processing circuit 47 makes the voltage detecting circuit 31 operate at relatively long time intervals immediately after the start of processing, and at shorter intervals according as the end of the expected lifetime of the battery is approaching.

Figure 10:
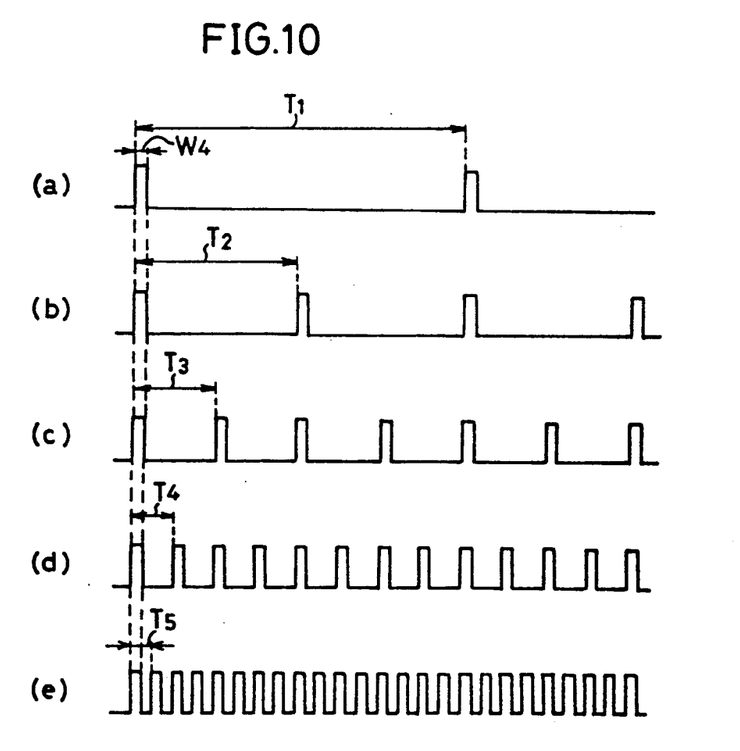
FIG. 10 is a waveform chart showing five types of signals for enabling a voltage detecting circuit according to the second preferred embodiment.

Referring to FIG. 10 (a), during the period between the start of processing and Tk/5, the processing circuit 47 intermittently outputs the control signal CT for a duration W4 at intervals of T1. The duration W4 is long enough for the voltage detecting circuit 31 to become able to provide a stable output signal DET.

Referring to FIG. 10 (b) during the period between Tk/5 and 2Tk/5, the processing circuit 47 outputs the control signal CT at intervals of T2. The time intervals T2 and T1 have, for example, the following relationship.

$$T2 = T1/2 \qquad (2)$$

Referring to FIG. 10 (c), when the total operating time of the battery 2 is between 2Tk/5 and 3Tk/5, the processing circuit 47 outputs the control signal CT at intervals of T3 (=T2/2=T1/4).

Similarly, when the total operating time of the battery 2 is between the time periods between 3Tk/5 and 4Tk/5, and between 4Tk/5 and Tk, the processing circuit 47 outputs the control signal CT at intervals of T4 (=T3/2) and T5 (=T4/2), respectively.

As described above, by selecting intervals T1 to T5, the apparatus can detect the end of the life of the battery 2 with sufficient precision to avoid undesirable things, without consuming any excessive power.

Figure 11:
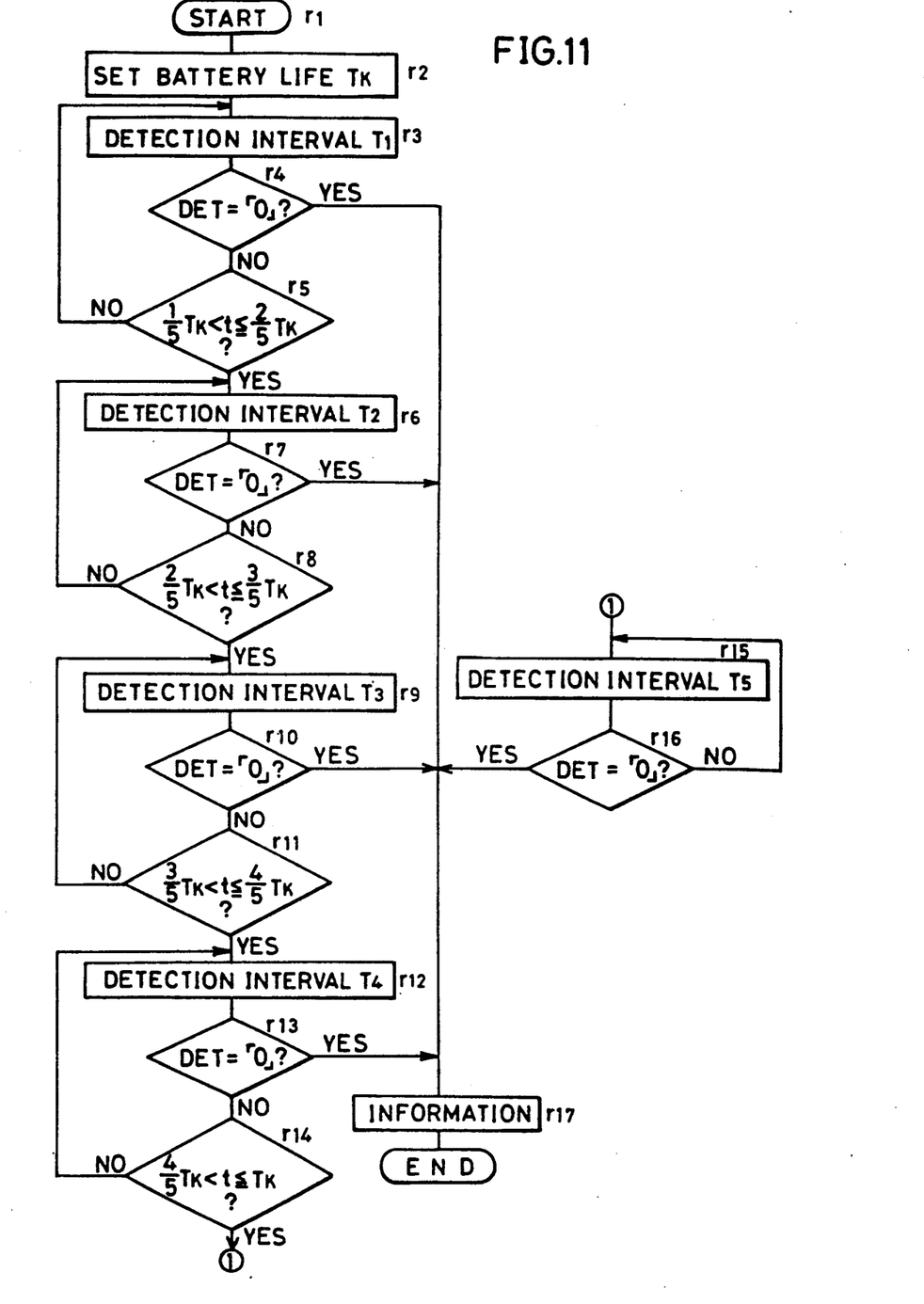
FIG. 11 is a flow chart of a program in which intervals of enabling a voltage detecting circuit are determined according to the second preferred embodiment of the present invention.

Referring to FIG. 11, a program executed by the processing circuit 47 operates as follows.

Upon setting the battery 2 in a predetermined position, power is supplied to the apparatus 30 for detecting end of battery life, thereby starting the program at step r1.

At step r2, an expected lifetime Tk of the battery 2 is set. That is, an operator enters the approximate lifetime Tk of the battery 2 in the processing circuit 47 with the input unit 36. The processing circuit 47 sets the timer 42 for the received lifetime Tk. Alternatively, the battery lifetime Tk may be stored in the ROM 45 in advance. In this case, the processing circuit 47 reads out the lifetime Tk from the ROM 45 and sets the timer 42 therefor.

At step r3, after the interval T1 as shown in FIG. 10 (a), the processing circuit 47 applies the control signal CT to the switch 28. The application of the control signal CT to the switch 28 for the sufficient time W4 allows the input port P7 to receive output of the voltage detecting circuit 31. The processing circuit 47 accepts the signal DET applied to the input port P7 after it becomes stable enough.

At step r4, it is determined whether the signal DET is logical "0" or not. If the determination is YES, the control proceeds to step r17, and if not, to step r5.

At step r17, since the voltage Vcc of the battery 2 has fallen below a predetermined voltage, a message that life of the battery 2 has ended is given by the display unit 3.

At step r5, it is determined whether or not the total operating time satisfies the following relational expression.

$$1/5\ Tk < t \leq 2/5\ Tk \qquad (3)$$

If the determination is YES, the control proceeds to step r6, and if not, returns to step r3. When the control has returned to step r3, the processing circuit 47 repeats the operation described above after the interval of T1.

At step r6, the processing circuit 47 outputs the control signal CT to the switch 28 after the interval T2 (=T1/2) as shown in FIG. 10 (b). The processing circuit 7 accepts the signal DET from the voltage detecting circuit 31 after it gets stable enough. The processing circuit 47 then stops outputting the control signal CT.

At step r7, it is determined whether the received signal DET is logical "0" or not. If the determination is YES, the control proceeds to step r17, and if not, to step r8.

At step r8, it is determined whether the total operating time t of the battery 2 satisfies the following relational expression.

$$2/5 \; Tk < t \leq 3/5 \; Tk \quad (4)$$

If the determination is YES, the control proceeds to step r9, and if not, returns to step r6. When the control has returned to step r6, the processing circuit 47 outputs the control signal CT to repeat the operation described above after the interval T2.

At step r9, the processing circuit 47 applies the control signal CT to the switch 28 after the interval T3 as shown in FIG. 10 (c). The processing circuit 47 accepts the signal DET from the voltage detecting circuit 31 after it becomes stable enough. The processing circuit 47 then stops outputting the control signal CT.

At step r10, the processing circuit 47 makes determination as to whether the signal DET is logical "0" or not. If the determination is YES, the control proceeds to step r17, and if not, to step r11.

At step r11, it is determined whether or not the total operating time t of the battery 2 satisfies the following relational expression.

$$3/5 \; Tk < t \leq 4/5 \; Tk \quad (5)$$

If the determination is YES, the control proceeds to step r12, and if not, returns to step r9.

If the control returns to step r9, the processing circuit 47 resumes applying the control signal CT to the switch 28 after the interval t3 to repeat the operation described above.

At step r12, the processing circuit 47 applies the control signal CT to the switch 28 after the interval T4 as shown in FIG. 10 (d). The processing circuit 47 accepts the signal DET from the voltage detecting circuit 31 after it gets stable enough. The processing circuit 47 then stops outputting the control signal CT.

At step r13, it is determined whether the signal DET is logical "0" or not. If the determination is YES, the control proceeds to step r17, and if not, to step r14.

At step r14, it is determined whether or not the total operating time t of the battery 2 satisfies the following expression.

$$4/5 \; Tk < t \leq Tk \quad (6)$$

If the determination is YES, the control proceeds to step r15, and if not, returns to step r12.

If the control returns to step r12, the processing circuit 47 repeats the operation described above after the interval T4.

At step r15, the processing circuit 47 outputs the control signal CT to the switch 28 after the interval T5 as shown in FIG. 10 (e). The processing circuit 47 accepts the signal DET from the voltage detecting circuit 31 after it gets stable enough. The processing circuit 47 then stops outputting the control signal CT.

At step r16, it is determined whether the received control signal DET represents logical "0" or not. If the determination is YES, the control proceeds to step r17, and if not, returns to step r15. Thereafter, the processings of steps r15 and r16 are repeated until a determination of YES can be obtained at step r16.

If the determinations at steps r4, r7, r10, r13 and r 16 are YES, the control proceeds straight to step r17 for each case. At step r17, since the voltage Vcc has fallen below the predetermined voltage, the processing circuit 47 informs users with the display unit 3 that life of the battery 2 has ended.

After step r17, the program comes to an end.

As has been described above, according to the second preferred embodiment, an expected lifetime of the battery 2 is given to the processing circuit 47 with the input unit 36 in advance. The processing circuit 47 divides the received lifetime of the battery 2 into, for example, five equal periods, and each time one of the five periods passes, reduces by half the interval of enabling the voltage detecting circuit 31. This allows the voltage detecting circuit 31 to be enabled only a small number of times immediately after replacement of the battery 2, and more frequently according as the expected life end of the battery 2 is approaching. Therefore, when the life of the battery 2 is less likely to end, the voltage detecting circuit 31 consumes a lower power, while when the expected life end of the battery 2 is approaching, the voltage detecting circuit 31 performs monitoring frequently. Accordingly, it becomes possible to detect the life end of the battery 2 with sufficient precision, without consuming an excessive power.

As described above, the processing circuit 47 can be put in the stand-by state. At steps r3, r6, r9, r12 and r15 in FIG. 11, the processing circuit 47 need not operate until the periods T1 to T5 pass, respectively. During these periods, therefore, the processing circuit 47 can be put in the stand-by state. Accordingly, the consumption power of the processing circuit 47 can be further reduced.

It is assumed for example that the current consumed by the voltage detecting circuit 31 is about 500 μA to 1 mA. Meanwhile, the consumed current of the processing circuit 47 in the stand-by state is about several tens μA as described above. When compared with the conventional case where current flows through the voltage detecting circuit 31 on a constant basis, therefore, the current consumed by the apparatus is reduced to about a several tenth according to the present embodiment.

In the second embodiment described above, the lifetime Tk of the battery 2 is divided into five equal periods. For each one of the five periods, the interval of enabling voltage detecting circuit 31 is set to a half of the interval in the preceding period. However, the present invention is not limited to the above-described case. For example, the received battery lifetime Tk may be divided into six or more equal periods. The interval in each period needs only to be shorter than that in the period just before.

The present invention is directed to detecting a point of time when the electromotive force of the battery 2 becomes insufficient. The present invention can be applied, therefore, not only to a primary battery which must be disposed of once its life has come to an end, but to a secondary battery which can be reused.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for detecting end of battery life which is used in a system powered by a battery, comprising:
   electromotive force comparing means connected to be supplied with power from said battery for comparing the electromotive force of said battery with a predetermined value;
   a processing device including a memory for storing an application program for execution by said processing device, said application program intermittently enabling said electromotive force comparing means to compare said battery electromotive force with said predetermined value.

2. The apparatus according to claim 1, further comprising:
   display means responsive to an output of said electromotive force comparing means for giving a warning when the electromotive force of said battery is smaller than said predetermined value.

3. The device according to claim 2, wherein said display means comprises a warning display means which consumes relatively low power.

4. An apparatus for detecting end of battery life which is used in a system powered by a battery, comprising:
   electromotive force comparing means connected to obtain power from said battery for comparing the electromotive force of said battery with a predetermined value;
   intermittent enabling means for intermittently generating an enabling signal enabling said electromotive force comparing means; and
   said intermittent enabling means comprises an enabling signal generating means which generates said enabling signal for intermittently enabling said electromotive force comparing means at time intervals determined as a function of the electromotive force level of said battery.

5. The apparatus according to claim 4, wherein said intermittent enabling means further comprises switching means responsive to said enabling signal for allowing power to be supplied from said battery to said electromotive force comparing means only when said enabling signal is present.

6. The apparatus according to claim 4, wherein said electromotive force comparing means comprises:
   first voltage dividing means for dividing DC voltage applied from said battery in a predetermined first ratio; and
   first voltage comparing means for comparing the DC voltage divided by said first voltage dividing means with a predetermined reference voltage.

7. The apparatus according to claim 6, wherein said electromotive force comparing means further comprises:
   second voltage dividing means for dividing the DC voltage applied from said battery in a predetermined second ratio smaller than said first ratio;
   the DC voltage divided by said second voltage dividing means being lower than the DC voltage divided by said first voltage dividing means; and
   second voltage comparing means for comparing the DC voltage divided by said second voltage dividing means with said reference voltage.

8. The apparatus according to claim 7, wherein said enabling signal generating means further comprises means responsive to the comparison results of said second voltage comparing means for generating said enabling signal at intervals of a predetermined first time if the DC voltage divided by said second voltage dividing means is higher than said reference voltage, and in other cases, at intervals of a predetermined second time shorter than said first time.

9. An apparatus for detecting end of battery life which is used in a system powered by a battery, comprising:
   electromotive force comparing means connected to obtain power from said battery for comparing the electromotive force of said battery with a predetermined value;
   intermittent enabling means for intermittently generating an enabling signal enabling said electromotive force comparing means; and
   said intermittent enabling means comprises:
   time measuring means for measuring an elapsed time from a predetermined time;
   time comparing means for comparing the elapsed time measured by said time measuring means with a predetermined reference time; and
   means for generating said enabling signal at intervals of a predetermined first time before said reference time passes, and at intervals of a predetermined second time shorter than said first time after said reference time has passed.

10. The apparatus according to claim 9, wherein said second time interval is a half of said first time.

11. The apparatus according to claim 9, further comprising:
    means for resetting contents of said time measuring means.

12. The apparatus according to claim 11, wherein said enabling signal generating means comprises:
    storage means for storing said reference time; and
    entry means for entering said reference time in said storage means.

* * * * *